US009852900B2

(12) United States Patent
Peddeti et al.

(10) Patent No.: US 9,852,900 B2
(45) Date of Patent: Dec. 26, 2017

(54) OXIDIZING FILLER MATERIAL LINES TO INCREASE WIDTH OF HARD MASK LINES

(71) Applicant: GLOBALFOUNDRIES Inc., Grand Cayman (KY)

(72) Inventors: Shivaji Peddeti, Ballston Lake, NY (US); Chang Maeng, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/093,212

(22) Filed: Apr. 7, 2016

(65) Prior Publication Data

US 2017/0294304 A1    Oct. 12, 2017

(51) Int. Cl.
*H01L 21/02*    (2006.01)
*H01L 21/31*    (2006.01)
*H01L 21/311*    (2006.01)
*H01L 21/67*    (2006.01)

(52) U.S. Cl.
CPC .. *H01L 21/02238* (2013.01); *H01L 21/31116* (2013.01); *H01L 21/31144* (2013.01); *H01L 21/67069* (2013.01); *H01L 21/02252* (2013.01)

(58) Field of Classification Search
CPC ............ H01L 21/308; H01L 21/31144; H01L 21/0337; H01L 21/02238; H01L 21/0332; H01L 21/31105; H01L 21/823456; H01L 21/823475
See application file for complete search history.

(56) References Cited

U.S. PATENT DOCUMENTS

2015/0064912 A1    3/2015    Jang et al.

OTHER PUBLICATIONS

Office Action for U.S. Appl. No. 15/093,272, dated Jan. 23, 2017.
Final Office Action for U.S. Appl. No. 15/093,272, dated Apr. 26, 2017.
Office Action for U.S. Appl. No. 15/093,272, dated May 17, 2017.
Lapeyre, C., et al., "Cost Effective SADP based on Spin on Carbon," Proc. Int. Symp. on Lithography Extensions, Oct. 20-22, 2010, pp. 2-25. Oct. 22, 2010.
Hui et al., U.S. Appl. No. 15/093,292, filed Apr. 7, 2016, entitled "Protecting, Oxidizing, and Etching of Material Lines for Use in Increasing or Decreasing Critical Dimensions of Hard Mask Lines." Apr. 7, 2016.
Peddeti, U.S. Appl. No. 15/093,272, filed Apr. 7, 2016, entitled "Integration of Nominal Gate Width Finfets and Devices Having Larger Gate Width." Apr. 7, 2016.
Hui et al., U.S. Appl. No. 15/093,310, filed Apr. 7, 2016, entitled "Oxidizing, and Etching of Material Lines For Use in Increasing or Decreasing Critical Dimensions of Hard Mask Lines." Apr. 7, 2016.

*Primary Examiner* — Seahvosh Nikmanesh
(74) *Attorney, Agent, or Firm* — Wayne F. Reinke, Esq.; Heslin Rothenberg Farley & Mesiti P.C.

(57) ABSTRACT

A starting semiconductor structure includes a layer of filler material, a hard mask layer over the layer of filler material, and filler material lines over the hard mask layer. The starting semiconductor structure is placed in an etching chamber, and oxygen gas and high plasma power are inserted into the etching chamber and oxidizing, resulting in one or more of the filler material lines being oxidized, the filler material line(s) increasing in width from oxidizing, and etching the hard mask layer with a chemistry that is non-selective to the oxidized filler material lines and hard mask layer, and which has a stronger lateral etch selectivity to the oxidized filler material lines than the hard mask layer.

10 Claims, 4 Drawing Sheets

OXIDIZING FILLER MATERIAL LINES TO INCREASE WIDTH OF HARD MASK LINES

BACKGROUND OF THE INVENTION

Technical Field

The present invention generally relates to FinFET fabrication using a replacement metal gate (RMG) process. More particularly, the present invention relates to fabrication of FinFETs using a RMG process and having wider than nominal gates.

Background Information

In order to continue reducing the size of semiconductor devices (transistors), self-aligned double and quadruple patterning processes have been developed for replacement metal gate processes to increase dummy gate width. However, these processes use non-lean chemistry, which increases cost, suffer low etch rates lowering throughput, and/or increased defects reducing yield.

Thus, a need exists for a way to increase dummy gate width that does not increase costs, lower throughput or reduce yields.

SUMMARY OF THE INVENTION

The shortcomings of the prior art are overcome and additional advantages are provided through the provision, in one aspect, of a method of oxidizing filler material lines to increase width of hard mask lines. The method includes providing a starting semiconductor structure, the starting semiconductor structure including a layer of filler material, a hard mask layer over the layer of filler material, and a plurality of filler material lines over the hard mask layer. The method further includes placing the starting semiconductor structure in an etching chamber, inserting oxygen gas and plasma into the etching chamber after the placing such that one or more of the plurality of filler material lines are oxidized, the oxidized one or more of the plurality of filler material lines increasing in width, and etching the hard mask layer with a chemistry that is non-selective to the oxidized filler material lines and hard mask layer, and which has a stronger lateral etch selectivity to the oxidized filler material lines than the hard mask layer.

In another aspect, a semiconductor structure is provided. The semiconductor structure includes a layer of filler material, a hard mask layer over the layer of filler material, and a plurality of filler material lines having one or more first widths over the hard mask layer, forming a tri-layer structure.

These, and other objects, features and advantages of this invention will become apparent from the following detailed description of the various aspects of the invention taken in conjunction with the accompanying drawings.

DETAILED DESCRIPTION OF THE INVENTION

Figure 1:
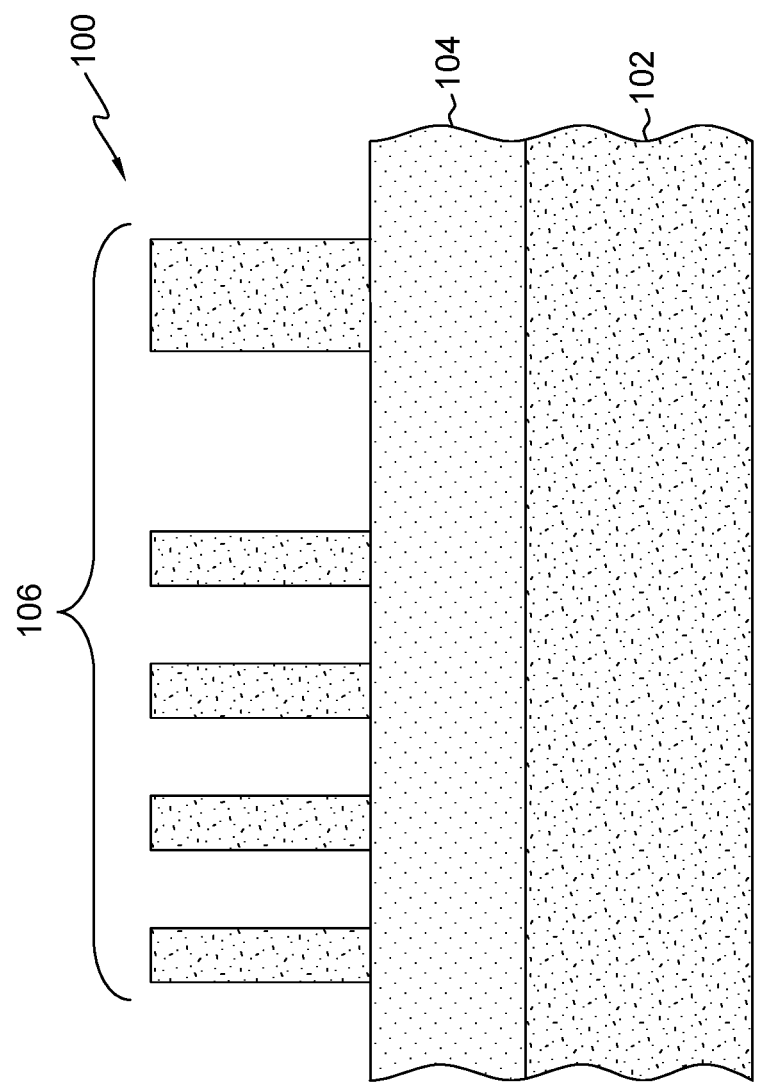
FIG. 1 is a cross-sectional view of one example of a starting semiconductor structure, the starting semiconductor structure including a layer of filler material, a hard mask layer over the layer of filler material, and multiple filler material lines over the hard mask layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the starting semiconductor structure including a layer of filler material 102 (e.g., amorphous silicon or polysilicon), a hard mask layer 104 over the layer of filler material, and multiple filler material lines 106 over the hard mask layer, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures may be included on the same bulk substrate.

Figure 2:
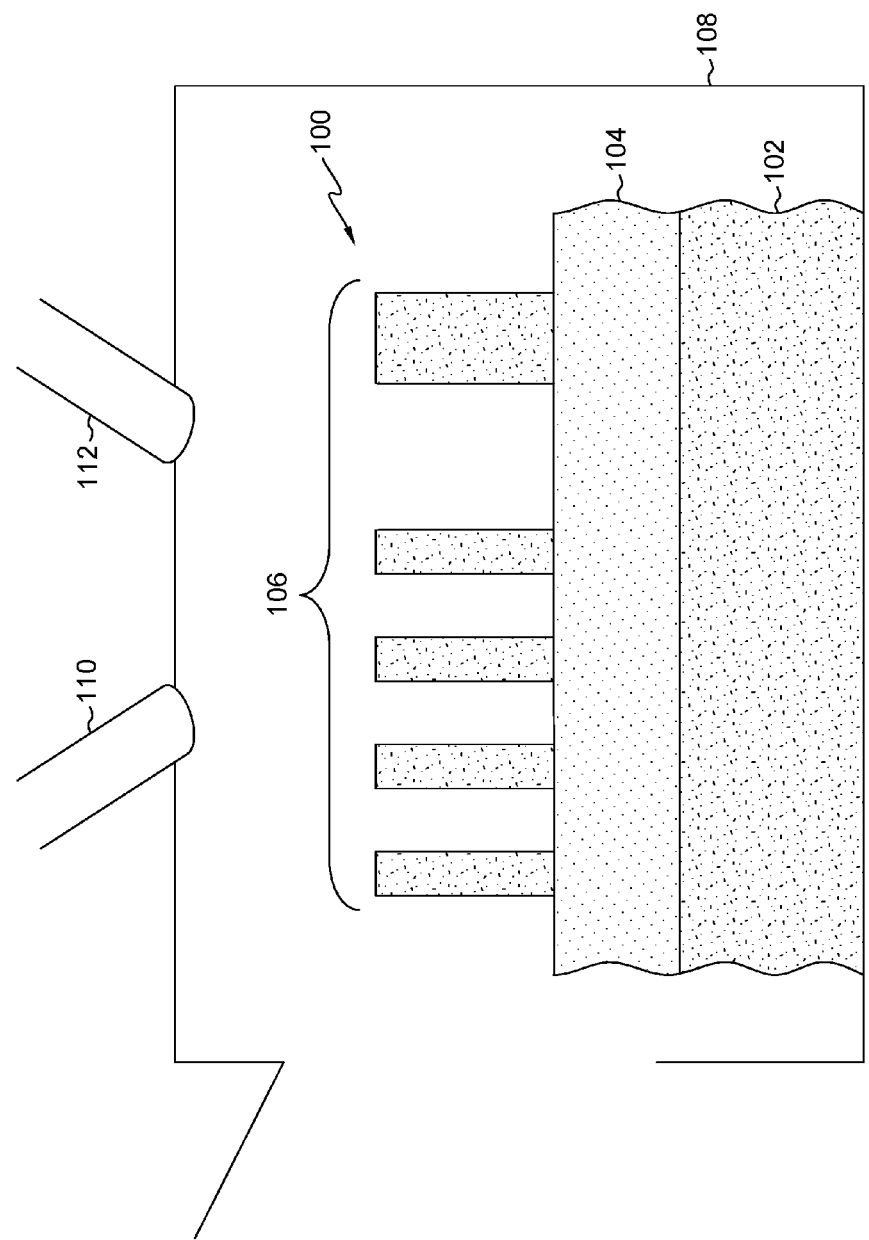
FIG. 2 is a simplified view of one example of placing the starting semiconductor structure 100 of FIG. 1 into an etching chamber with a gas line for oxygen and a line for plasma, in accordance with one or more aspects of the present invention.

FIG. 2 is a simplified view of one example of placing the starting semiconductor structure 100 of FIG. 1 into an etching chamber 108 with a gas line for oxygen 110 and a line for plasma 112, in accordance with one or more aspects of the present invention.

Figure 3:
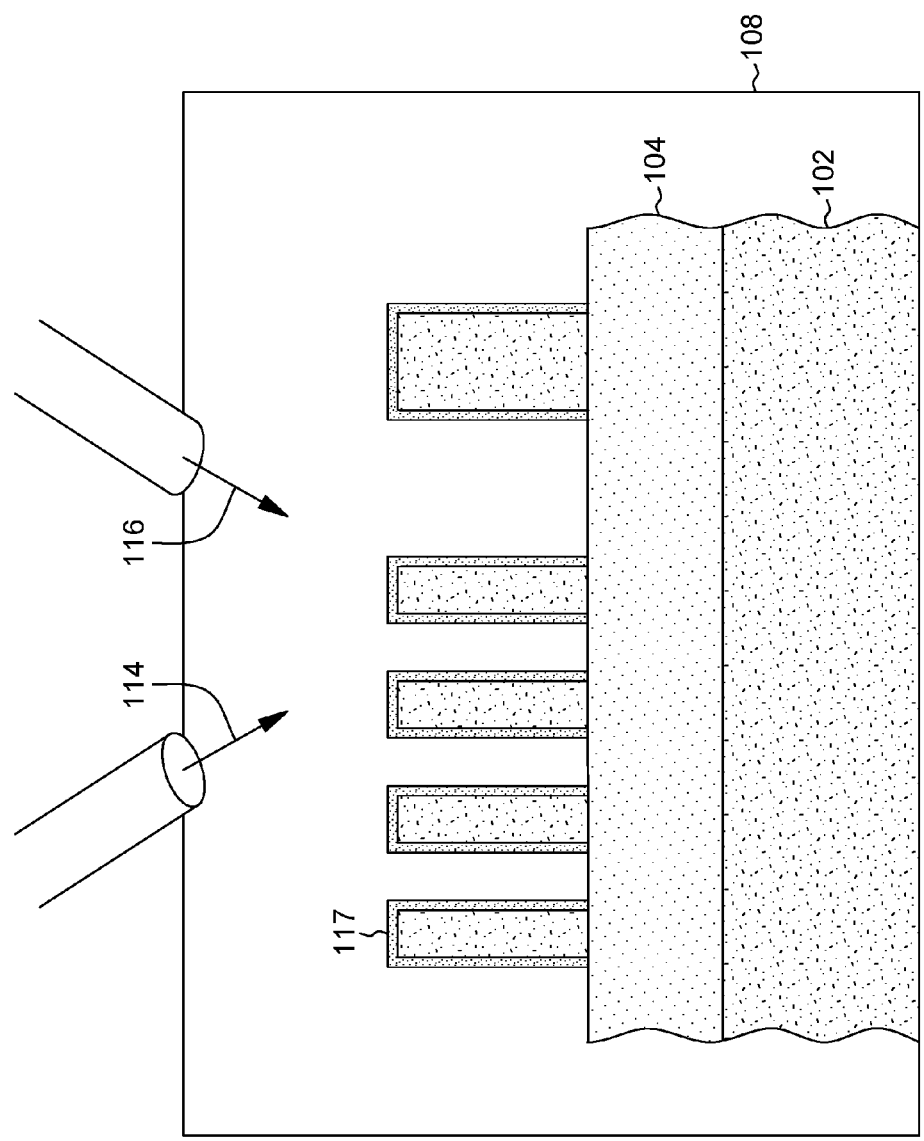
FIG. 3 is a simplified view of one example of inserting oxygen and plasma into the etching chamber, and oxidizing the filler material lines, in accordance with one or more aspects of the present invention.

FIG. 3 is a simplified view of one example of inserting oxygen and plasma, 114 and 116, respectively, into etching chamber 108, and oxidizing 117 the filler material lines 106, in accordance with one or more aspects of the present invention.

Figure 4:
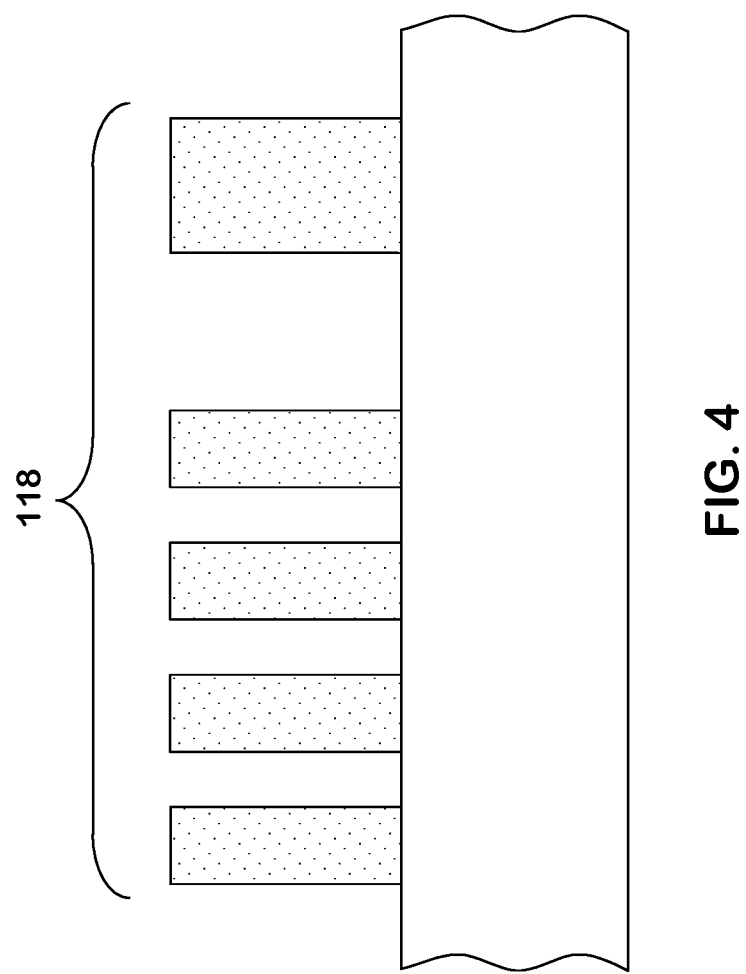
FIG. 4 depicts the semiconductor structure of FIG. 3 after etching the hard mask layer using the oxidized filler material lines as mandrels, creating wider hard mask lines, in accordance with one or more aspects of the present invention.

FIG. 4 depicts the semiconductor structure of FIG. 3 after etching the hard mask layer 104 using the oxidized filler material lines 106 as mandrels, creating wider hard mask lines 118, in accordance with one or more aspects of the present invention.

In a first aspect, disclosed above is a method. The method includes providing a starting semiconductor structure, the starting semiconductor structure including a layer of filler material, a hard mask layer over the layer of filler material, and filler material lines over the hard mask layer. The method further includes placing the starting semiconductor structure in an etching chamber, inserting oxygen gas with high plasma power (about 500 to about 2,000 watts) into the etching chamber after the placing such that one or more of the filler material lines are oxidized, the oxidized one or more of the filler material lines increasing in width, and etching the hard mask layer with a chemistry that is non-selective to the oxidized filler material lines and hard mask layer, and which has a stronger lateral etch selectivity to the oxidized filler material lines than the hard mask layer.

In one example, more than one cycle of inserting and etching may be, for example, performed, further increasing the width of the oxidized one or more of the plurality of filler material lines. In one example, width increases by about 1 nm to about 10 nm. In one example, for x cycles, each cycle performs the etching 1/x of desired width increase.

In one example, a maximum width increase of the filler material lines in the method of the first aspect from a single cycle of oxidizing and etching is about 3 nm.

In one example, the width of the filler material lines in the method of the first aspect can also be altered, for example, using a time of oxidation. In one example, where a maximum width increase from a single cycle of oxidizing and etching is about 3 nm, a width increase of less than about 3 nm can be achieved, for example, by reducing a time of oxidation.

In one example, the filler material in the method of the first aspect of the first aspect may include, for example, amorphous silicon.

In one example, the filler material in the method of the first aspect of the first aspect may include, for example, polysilicon.

In one example, the plasma power in the method of the first aspect may have, for example, a power of about 500 watts to about 2,000 watts.

In a second aspect, disclosed above is a semiconductor structure. The semiconductor structure includes a layer of filler material, a hard mask layer over the layer of filler material, and filler material lines having first width(s) over the hard mask layer, forming a tri-layer structure.

In one example, the semiconductor structure may further include, for example, an etching chamber with the tri-layer structure therein, a first inlet to the etching chamber for a first gas, and a second inlet to the etching chamber for a second gas. In one example, one or more of the filler material lines may include, for example, an outer oxidation layer having second width(s) larger than the corresponding first width(s). In one example, where the outer oxidation layer(s) are present, a thickness of the outer oxidation layer may include, for example, about 1 nm to about 10 nm.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A method, comprising:
providing a starting semiconductor structure, the starting semiconductor structure comprising a layer of filler material, a hard mask layer over the layer of filler material, and a plurality of filler material lines over the hard mask layer;
placing the starting semiconductor structure in an etching chamber;
inserting oxygen gas and plasma into the etching chamber after the placing such that one or more of the plurality of filler material lines are oxidized, the oxidized one or more of the plurality of filler material lines increasing in width; and
etching the hard mask layer with a chemistry that is non-selective to the oxidized filler material lines and hard mask layer, and which has a stronger lateral etch selectivity to the oxidized filler material lines than the hard mask layer.

2. The method of claim 1, wherein more than one cycle of inserting and etching is performed, further increasing the width of the oxidized one or more of the plurality of filler material lines.

3. The method of claim 2, wherein the width increases by about 1 nm to about 10 nm.

4. The method of claim 2, wherein for x cycles, each cycle performs the etching 1/x of desired width increase.

5. The method of claim 1, wherein a maximum width increase from a single cycle of oxidizing and etching is about 3 nm.

6. The method of claim 1, wherein the width can also be altered using a time of oxidation.

7. The method of claim 6, wherein a maximum width increase from a single cycle of oxidizing and etching is about 3 nm, and wherein a width increase of less than about 3 nm can be achieved by reducing a time of oxidation.

8. The method of claim 1, wherein the filler material comprises amorphous silicon.

9. The method of claim 1, wherein the filler material comprises polysilicon.

10. The method of claim 1, wherein the plasma has a power of about 500 watts to about 2,000 watts.

\* \* \* \* \*